United States Patent
Fan et al.

(10) Patent No.: US 10,754,397 B2
(45) Date of Patent: Aug. 25, 2020

(54) WATER-COOLED SERVER AND ELECTRONIC DEVICE

(71) Applicant: Lenovo (Beijing) Co., Ltd., Beijing (CN)

(72) Inventors: Jui-Chan Fan, Beijing (CN); Jeng-Ming Lai, Beijing (CN); Ting Tian, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/372,799

(22) Filed: Apr. 2, 2019

(65) Prior Publication Data

US 2019/0302859 A1    Oct. 3, 2019

(30) Foreign Application Priority Data

Apr. 2, 2018    (CN) .......................... 2018 1 0283629

(51) Int. Cl.
    *H05K 7/20*    (2006.01)
    *G06F 1/20*    (2006.01)
(52) U.S. Cl.
    CPC ........... *G06F 1/20* (2013.01); *H05K 7/20745* (2013.01); *H05K 7/20818* (2013.01)
(58) Field of Classification Search
    CPC combination set(s) only.
    See application file for complete search history.

(56) References Cited

U.S. PATENT DOCUMENTS

| 4,183,400 | A | * | 1/1980 | Seifert | ................... | H01L 23/467 |
|---|---|---|---|---|---|---|
| | | | | | | 165/104.29 |
| 4,319,630 | A | * | 3/1982 | Hronek | ................. | F28D 7/0008 |
| | | | | | | 165/140 |
| 5,190,099 | A | * | 3/1993 | Mon | ...................... | H01L 23/467 |
| | | | | | | 165/104.33 |
| 5,203,399 | A | * | 4/1993 | Koizumi | ............... | F25B 23/006 |
| | | | | | | 165/104.22 |
| 5,815,370 | A | * | 9/1998 | Sutton | ................ | H05K 7/20281 |
| | | | | | | 165/80.4 |

(Continued)

FOREIGN PATENT DOCUMENTS

| CN | 1340696 A | 3/2002 |
|---|---|---|
| CN | 1940365 A | 4/2007 |

(Continued)

*Primary Examiner* — Binh B Tran
*Assistant Examiner* — Krystal Robinson
(74) *Attorney, Agent, or Firm* — Anova Law Group, PLLC

(57) ABSTRACT

A water-cooled server and an electronic device are provided. The water-cooled server comprises a cooling main tubing, wherein the cooling main tubing guides cooling water; a drainage branch tubing operatively coupled to cooling main tubing; a piston having a first end disposed in the drainage branch tubing and a second end disposed in the cooling main tubing, wherein the first end drives the second end to a first position under pressure of the cooling water to prevent the second end from plugging the cooling main tubing; and an elastic member operatively coupled to the piston, wherein the elastic member drives the second end of the piston to move to a second position to plug the cooling main tubing. An elastic force applied to the piston by the elastic member is smaller than maximum pressure applied to the piston by the cooling water.

12 Claims, 2 Drawing Sheets

(56) References Cited

U.S. PATENT DOCUMENTS

| | | | | |
|---|---|---|---|---|
| 5,946,191 A * | 8/1999 | Oyamada | ............ | H05K 7/20672 165/104.14 |
| 6,144,553 A * | 11/2000 | Hileman | ............ | G11B 33/1413 165/104.33 |
| 6,307,746 B1 * | 10/2001 | Beckman | ................ | G06F 1/203 361/679.46 |
| 6,425,750 B1 * | 7/2002 | Yoon | ..................... | B29C 44/445 425/110 |
| 6,942,018 B2 * | 9/2005 | Goodson | ............... | F04B 19/006 165/104.21 |
| 7,011,142 B2 * | 3/2006 | Davies | ................... | F02M 31/20 165/170 |
| 7,586,741 B2 * | 9/2009 | Matsushima | ........... | G06F 1/206 361/679.47 |
| 8,050,036 B2 * | 11/2011 | Suzuki | ................... | G06F 1/203 165/104.33 |
| 8,289,701 B2 * | 10/2012 | Suzuki | ................... | F28F 3/025 165/104.33 |
| 9,267,694 B2 * | 2/2016 | Lang | ...................... | G05D 23/08 |
| 10,251,316 B1 * | 4/2019 | Nachefski | ................. | B01F 3/04 |
| 2002/0039280 A1 * | 4/2002 | O'Connor | ............. | B81B 1/00 361/690 |
| 2002/0075643 A1 * | 6/2002 | Nakagawa | ............ | G06F 1/1616 361/679.52 |
| 2003/0016498 A1 * | 1/2003 | Kurokawa | ......... | H05K 7/20254 361/699 |
| 2003/0019525 A1 * | 1/2003 | Shen | ...................... | G05D 16/10 137/494 |
| 2005/0081534 A1 * | 4/2005 | Suzuki | ................ | F28D 1/05366 62/50.2 |
| 2005/0155755 A1 * | 7/2005 | Matsuda | ................. | F28D 15/00 165/301 |
| 2006/0023436 A1 * | 2/2006 | Sugahara | ............. | B41J 2/14233 361/760 |
| 2007/0223193 A1 * | 9/2007 | Hamman | ........... | H05K 7/20218 361/689 |
| 2008/0196867 A1 * | 8/2008 | Spearing | ............ | H05K 7/20281 165/104.33 |
| 2012/0006527 A1 * | 1/2012 | Huang | ................ | G05D 23/1902 165/295 |
| 2013/0205822 A1 * | 8/2013 | Heiland | ............... | H05K 7/2079 62/259.2 |
| 2013/0255925 A1 * | 10/2013 | Koontz | ............... | H01L 23/4332 165/168 |
| 2015/0021007 A1 * | 1/2015 | Snaith | ....................... | F28B 9/08 165/302 |
| 2015/0138723 A1 * | 5/2015 | Shedd | ................ | H05K 7/20809 361/679.47 |
| 2017/0344060 A1 * | 11/2017 | Shibayama | ................ | G06F 1/1616 |
| 2019/0246523 A1 * | 8/2019 | Boyden | ............. | H05K 7/20445 |

FOREIGN PATENT DOCUMENTS

| | | |
|---|---|---|
| CN | 201145069 Y | 11/2008 |
| CN | 101617281 A | 12/2009 |
| CN | 107327651 A | 11/2017 |

* cited by examiner

WATER-COOLED SERVER AND ELECTRONIC DEVICE

CROSS-REFERENCES TO RELATED APPLICATIONS

This application claims the priority of Chinese patent application No. 201810283629.X, filed on Apr. 2, 2018, the entire content of all of which is incorporated herein by reference.

FIELD OF THE DISCLOSURE

The present disclosure relates to the field of electronic device technologies and, more particularly, relates to a water-cooled server and an electronic device including the water-cooled server.

BACKGROUND

In some electronic devices such as computers, water-cooled servers are generally adopted to improve the performance of the electronic devices. One of the biggest security concerns in the electronic devices equipped with the water-cooled server is a cooling water leak. At present, the industry mostly responds by water leak alarm to hand the cooling water leak in the water-cooled server, i.e., setting an alarm system in the electronic devices. After the alarm system is alarmed due to the water leak, an operator manually turns off the water-cooled server and related devices. However, such a coping style requires human involvement, which leads to complicated operation, low efficiency and slow response to the water leak.

BRIEF SUMMARY OF THE DISCLOSURE

One aspect of the present disclosure provides a water-cooled server. The water-cooled server comprises: a cooling main tubing, wherein the cooling main tubing guides cooling water; a drainage branch tubing operatively coupled to cooling main tubing; a piston having a first end disposed in the drainage branch tubing and a second end disposed in the cooling main tubing, wherein the first end drives the second end to a first position under pressure of the cooling water to prevent the second end from plugging the cooling main tubing; and an elastic member operatively coupled to the piston, wherein the elastic member drives the second end of the piston to move to a second position to plug the cooling main tubing. An elastic force applied to the piston by the elastic member is smaller than maximum pressure applied to the piston by the cooling water.

Another aspect of the present disclosure provides an electronic device comprising a water-cooled server. The water-cooled server comprises: a cooling main tubing, wherein the cooling main tubing guides cooling water; a drainage branch tubing operatively coupled to cooling main tubing; a piston having a first end disposed in the drainage branch tubing and a second end disposed in the cooling main tubing, wherein the first end drives the second end to a first position under pressure of the cooling water to prevent the second end from plugging the cooling main tubing; and an elastic member operatively coupled to the piston, wherein the elastic member drives the second end of the piston to move to a second position to plug the cooling main tubing. An elastic force applied to the piston by the elastic member is smaller than maximum pressure applied to the piston by the cooling water.

Other aspects of the present disclosure may be understood by those skilled in the art in light of the description, the claims, and the drawings of the present disclosure.

BRIEF DESCRIPTION OF THE DRAWINGS

To more clearly illustrate technical solutions of embodiments or in the prior art, accompany drawings which need to be used in the description of the embodiments or the prior art will be simply introduced. Obviously, the accompany drawings in the following description are merely some embodiments, and for those of ordinary skill in the art, other embodiments can further be obtained according to these accompany drawings without contributing any creative work.

In FIGS. 1-2, the various reference numerals and corresponding names are as follows: 1—cooling main tubing, 2—drainage branch tubing, 3—piston, 4—elastic member, 5—cooler, 6—barrier, 11—water inlet, 12—water outlet, 31—first end, and 32—second end.

DETAILED DESCRIPTION

Reference will now be made in detail to example of an embodiments of the disclosure, which are illustrated in the accompanying drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The present disclosure provides a water-cooled server, which is capable of automatically and timely shutting down a water-cooled server in the event of water leaks without human involvement, thereby improving the efficiency of treating the water leaks in the water-cooled server.

Figure 1:
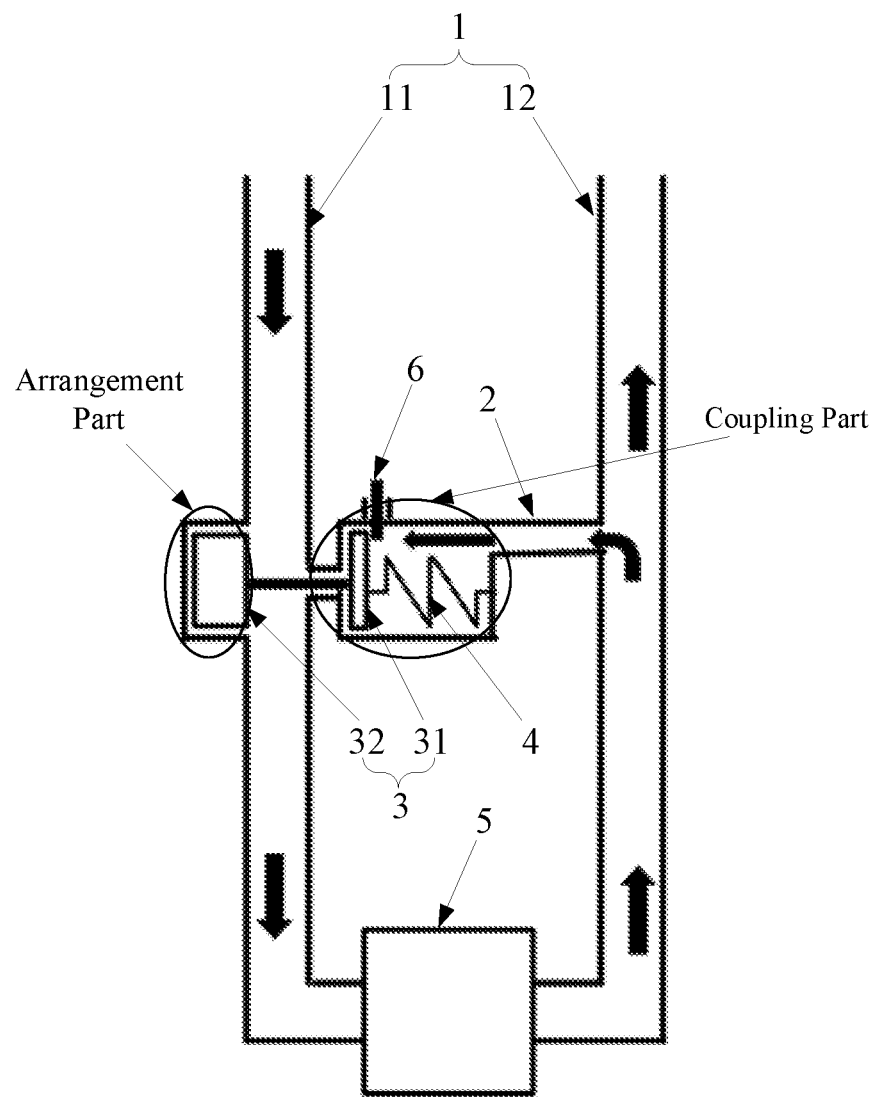
FIG. 1 illustrates a partial schematic view of an exemplary water-cooled server according to an embodiment of the present disclosure when a second end of a piston is at a first position.
Figure 2:
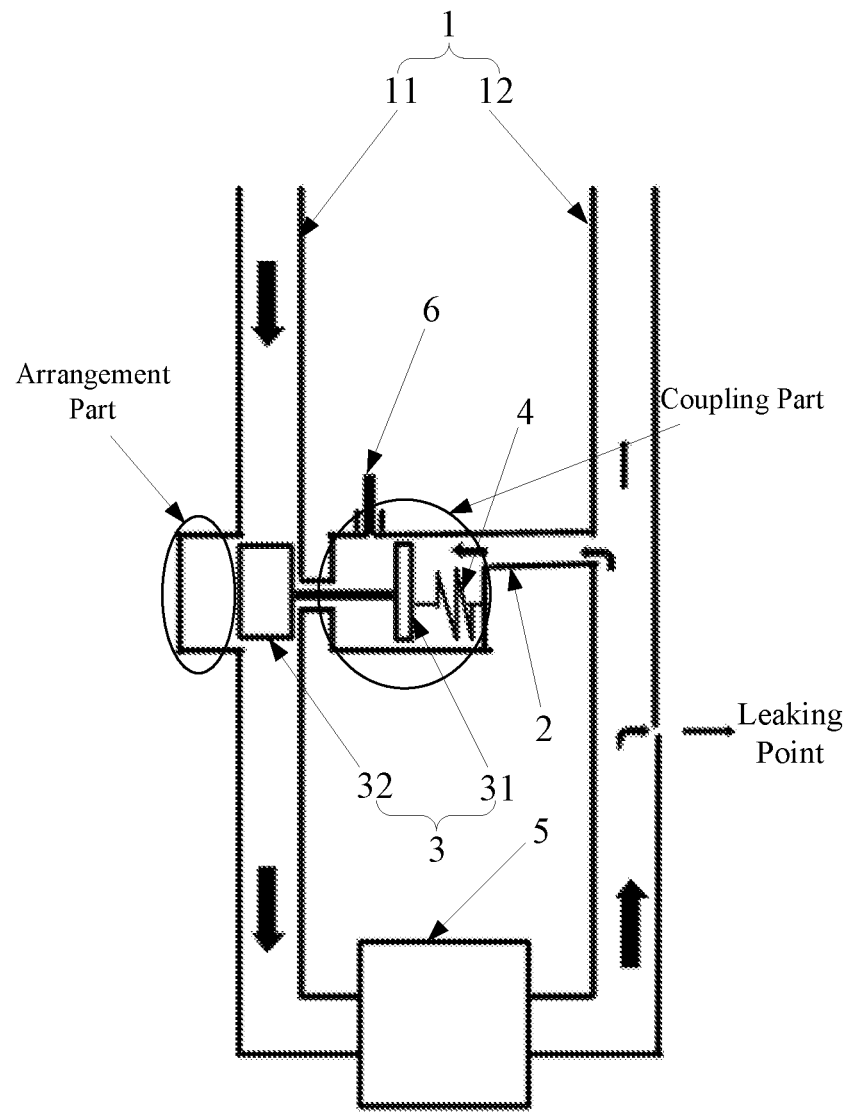
FIG. 2 illustrates a partial schematic view of an exemplary water-cooled server according to an embodiment of the present disclosure when a second end of a piston is at a second position.

FIG. 1 illustrates a partial schematic view of an exemplary water-cooled server according to an embodiment of the present disclosure when a second end of a piston is at a first position, and FIG. 2 illustrates a partial schematic view of an exemplary water-cooled server according to an embodiment of the present disclosure when a second end of a piston is at a second position.

As shown in FIG. 1 and FIG. 2 (the arrows indicate the flow direction of the cooling water), the water-cooled server may be installed in an electronic device such as a desktop computer. The water-cooled server may include a cooling main tubing 1, a drainage branch tubing 2, a piston 3 and an elastic member 4. The cooling main tubing may guide the cooling water, and the drainage branch tubing 2 may be operatively coupled to the cooling main tubing 1 and communicate with the cooling main tubing 1, such that the drainage branch tubing 2 may have the same water pressure as the cooling main tubing 1.

The piston 3 may include a first end 31 disposed in the drainage branch tubing 2 disposed in the cooling main tubing 1. When the water pressure in the drainage branch tubing 2 and the cooling main tubing 1 is at a normal value, i.e., normal water pressure, the first end 31 of the piston 3 may move to the end of the drainage branch tubing 2 under the influence of the normal water pressure, thereby driving the second end 32 of the piston 3 to move to a first position, as FIG. 1 shows. The second end 32 of the piston 3 may not block the cooling main tubing 1, and the cooling water may normally flow in the cooling main tubing 1.

The elastic member 4 may have one end fixedly coupled (the coupling position of one end of the elastic member 4 may have a variety of options, which will be discussed in the following) and another end operatively coupled to the first end 31 of the piston 3. Thus, the elastic member 4 may drive the piston 3 to move. The elastic force applied to the piston 3 by the elastic member 4 may be always smaller than the pressure applied to the piston 3 by the cooling water during the normal operation of the water-cooled server (i.e., the aforementioned normal water pressure), such that during the normal operation of the water-cooled server, the second end 32 of the piston 3 may be prevented from moving to the second position to affect the normal operation of the water-cooled server.

After a water leak occurs, the water pressure in the drainage branch tubing 2 and the cooling main tubing 1 may be lowered, such that after the pressure applied to the first end 31 by the cooling water becomes smaller than the elastic force applied by the elastic member 4, the second end 32 of the piston 3 may be driven by the elastic member 4 to move to the second position, thereby blocking the cooling main tubing 1, as FIG. 2 shows. The cooling water may be no longer continuously flowing and, thus, the cooling water may be prevented from continuously leaking.

The communication part of the drainage branch tubing 2 and the cooling main tubing 1 may be designed to enhance the performance of the water-cooled server. In one embodiment, the communication part of the drainage branch tubing 2 and the cooling main tubing 1, as well as, the arrangement part of the second end 32 in the cooling main tubing 1 may be respectively located at two sides of the cooler 5 of the water-cooled server. The cooler 5 may cool the water and circulate the cooling water, for example, directly through cold plates that contact the CPU thermal case, DIMMs, and other high-heat-producing components in the water-cooled server. In the disclosed embodiments, the two sides of the cooler 5 refer to the upstream and downstream of the cooler 5, as shown in FIGS. 1-2. In one embodiment, the communication part of the drainage branch tubing 2 and the cooling main tubing 1, as well as, the arrangement part of the second end 32 in the cooling main tubing 1 may be respectively located at the upstream and downstream of the cooler 5. In another embodiment, the communication part of the drainage branch tubing 2 and the cooling main tubing 1, as well as, the arrangement part of the second end 32 in the cooling main tubing 1 may be respectively located at the downstream and upstream of the cooler 5.

Through configuring the communication part (i.e., coupling part) of the drainage branch tubing 2 and the cooling main tubing 1, as well as, the arrangement part of the second end 32 in the cooling main tubing 1 to be respectively located at two sides of the cooler 5 of the water-cooled server, the normal operation of the cooler 5 may be ensured and, meanwhile, the arrangement of the drainage branch tubing 2 and the piston 3 may be facilitated. Thus, the structure of the water-cooled server may be simplified, and the changes introduced to the water-cooled server may be reduced, which may realize a better assembly of the water-cooled server and the existing structure of the electronic device. Meanwhile, the leakage of the cooling water may be reduced, and the relatively large amount of cooling water in the cooler 5 may also be prevented from being leaked. In another embodiment, the drainage branch tubing 2 and the piston 3 may be disposed on the same side (upstream or downstream) of the cooler 5 without considering the above factors.

In one embodiment, as shown in FIGS. 1 and 2, the second end 32 of the piston 3 may be disposed adjacent to a water inlet 11 of the cooling main tubing 1, and the coupling part between the drainage branch tubing 2 and the cooling main tubing 1 may be disposed adjacent to a water outlet 12 of the cooling main tubing 1. Because the water leak often occurs near the water outlet 12 of the cooling main tubing 1, through configuring the coupling part between the drainage branch tubing 2 and the cooling main tubing 1 to be disposed adjacent to the water outlet 12 of the cooling main tubing 1, the piston 3 may be able to sense the change of the water pressure timely and sensitively, thereby changing the position in time. Accordingly, the performance of treating the water leak may be enhanced.

Meanwhile, through configuring the second end 32 of the piston 3 to be disposed adjacent to a water inlet 11 of the cooling main tubing 1, the cooling water may be completely prevented from entering the cooling main tubing 1, and the continuous leakage of the cooling water may be prevented regardless of the water leak position in the cooling main tubing 1, thereby further enhancing the performance of treating the water leak.

In one embodiment, the elastic member 4 may be a spring that is disposed in the drainage branch tubing 2 and applies a pulling force to the first end 31 of the piston 3, as shown in FIGS. 1-2. The structure and arrangement of the elastic member 4 may be determined according to the various application scenarios, which is not limited by the present discourse. In certain embodiments, the elastic member 4 may be a spring disposed inside the drainage branch tubing 2, through which the influence of the newly introduced components on the assembly of the water-cooled server may be further reduced. In certain other embodiments, the elastic member 4 may be a shrapnel which is provided between the first end 31 and the outer wall of the cooling main tubing 1 to apply a pushing force to the first end 31.

In the disclosed embodiments, the water-cooled server may further comprise a barrier 6 which is movably disposed at the drainage branch tubing 2 and capable of blocking the first end 31 of the piston 3. In one embodiment, the barrier 6 may have a needle shape, for example, the barrier 6 may be a needle, as shown in FIGS. 1-2. The barrier 6 may be a member for controlling the activation and deactivation of the new structure. For example, provided that the water leak is not desired to be treated in a specific case, one end of the barrier 6 may be inserted into the drainage branch tubing 2 to form a blockage for the first end 31, such that the second end 32 of the piston 3 may be always in the first position and may not move to the second position, and the cooling main tubing 1 may be always unblocked. Provided that the water leak is desired to be treated, the barrier 6 may be moved out of the drainage branch tubing 2, such that the barrier 6 may no longer form a blockage for the piston 3, and the piston 3 may automatically and timely treat the water leak in the aforementioned manner.

Based on the disclosed water-cooled server, the present disclosure further provides an electronic device including a water-cooled server, which is any one of the disclosed water-cooled servers. Because the disclosed electronic device includes any one of the disclosed water-cooled servers, the disclosed electronic device may exhibit the same features as the disclosed water-cooled servers, and details are not described herein again.

In the disclose water-cooling server, the cooling main tubing may guide cooling water to realize the water cooling of the server. In addition to flowing in the cooling main tubing, the cooling water may also flow into the drainage branch tubing communicating with the cooling main tubing, such that the water pressure in the drainage branch tubing may be consistent with the water pressure in the cooling main tubing. The piston may be disposed in the drainage branch tubing, where the first end of the piston may be disposed in the drainage branch tubing, and the second end may be disposed in the cooling main tubing. The water pressure in the drainage branch tubing may be exerted on the first end of the piston, through which the second end of the piston may be enabled to move to the first position, and the second end of the piston may not form a blockage/barrier in the cooling main tubing.

Meanwhile, the elastic member may be operatively coupled to the piston, and the elastic force applied to the piston may move the second end of the piston from the first position to the second position. The second position is a position where the second end blocks the cooling main tubing to stop the cooling water from flowing in the cooling main tubing. Further, the elastic force applied to the piston by the elastic member may be always smaller than the maximum pressure applied to the piston by the cooling water. Thus, during the normal operation of the water-cooled server, the second end of the piston may remain in the first position under the influence of the water pressure, instead of being moved to the second position due to the elastic force of the elastic member. Thus, the smooth flow of the cooling main tubing may be ensured, and the water-cooled server may be operated normally.

After the water-cooled server leaks, the water pressure in the drainage branch tubing and the cooling main tubing may be lowered, such that the water pressure exerted on the piston may be insufficient to overcome the elastic force of the elastic member, and the elastic member may drive the piston to move. In particular, the elastic member may drive the second end of the piston to move from the first position to the second position, forming a blockage in the cooling main tubing. Thus, the cooling water may no longer flow in the cooling main tubing, and further leakage of the cooling water may be avoided.

That is, in the disclose water-cooling server, the plugging of the cooling main tubing by the piston may be automatically completed by the change of the water pressure without any human involvement. Further, based on the change of the water pressure, the plugging of the cooling main tubing may be realized in time at the initial stage of the water leak, which may improve the response to the water leak and the treatment of the water leak.

Various embodiments of the present specification are described in a progressive manner, in which each embodiment focusing on aspects different from other embodiments, and the same and similar parts of each embodiment may be referred to each other. The overall and partial structure of the water-cooled server may be referred to the combination of the various disclosed structures.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A water-cooled server, comprising:
  a cooling main tubing, wherein the cooling main tubing guides cooling water;
  a drainage branch tubing operatively coupled to the cooling main tubing;
  a piston having a first end disposed in the drainage branch tubing and a second end disposed in the cooling main tubing; and
  an elastic member operatively coupled to the piston to provide the piston with an elastic force, the elastic member being disposed in the drainage branch tubing; wherein:
  in response to a pressure of the cooling water being equal to or higher than a threshold, the pressure of the cooling water is greater than the elastic force of the piston, which causes the piston to move a first position that prevents the second end of the piston from plugging the cooling main tubing; and
  in response to a pressure of the cooling water being lower than a threshold, the pressure of the cooling water is smaller than the elastic force of the piston, which causes the piston to move to a second position such that the second end of the piston plugs the cooling main tubing.

2. The water-cooled server according to claim 1, wherein:
  a coupling part between the drainage branch tubing and the cooling main tubing and an arrangement part of the second end in the cooling main tubing are respectively disposed at both sides of a cooler of the water-cooled server.

3. The water-cooled server according to claim 1, wherein:
  the second end of the piston is disposed adjacent to a water inlet of the cooling main tubing, and
  a coupling part between the drainage branch tubing and the cooling main tubing is disposed adjacent to a water outlet of the cooling main tubing.

4. The water-cooled server according to claim 1, wherein:
  the elastic member is a spring that is disposed in the drainage branch tubing and applies a pulling force to the first end of the piston.

5. The water-cooled server according to claim 1, further comprising:
  a barrier movably disposed at the drainage branch tubing and capable of blocking the first end of the piston.

6. The water-cooled server according to claim 5, wherein:
  the barrier is a needle.

7. An electronic device, comprising:
  a water-cooled server, wherein the water-cooled server comprises:
  a cooling main tubing, wherein the cooling main tubing guides cooling water;
  a drainage branch tubing operatively coupled to the cooling main tubing;
  a piston having a first end disposed in the drainage branch tubing and a second end disposed in the cooling main tubing; and
  an elastic member operatively coupled to the piston to provide the piston with an elastic force, the elastic member being disposed in the drainage branch tubing; wherein:
  in response to a pressure of the cooling water being equal to or higher than a threshold, the pressure of the cooling water is greater than the elastic force of the piston, which causes the piston to move to a first position to prevent the second end of the piston from plugging the cooling main tubing; and in response to a pressure of the cooling water being lower than a threshold, the pressure of the cooling water is smaller than the elastic force of the piston, which causes the piston to move to a second position such that the second end of the piston plugs the cooling main tubing.

8. The electronic device according to claim 7, wherein:

a coupling part between the drainage branch tubing and the cooling main tubing and an arrangement part of the second end in the cooling main tubing are respectively located at both sides of a cooler of the water-cooled server.

9. The electronic device according to claim 7, wherein:

the second end of the piston is disposed adjacent to a water inlet of the cooling main tubing, and a coupling part between the drainage branch tubing and the cooling main tubing is disposed adjacent to a water outlet of the cooling main tubing.

10. The electronic device according to claim 7, wherein:

the elastic member is a spring that is disposed in the drainage branch tubing and applies a pulling force to the first end of the piston.

11. The electronic device according to claim 7, further comprising:

a barrier movably disposed at the drainage branch tubing and capable of blocking the first end of the piston.

12. The electronic device according to claim 11, wherein:

the barrier has a needle shape.

\* \* \* \* \*